United States Patent [19]
Hashimoto

[11] Patent Number: 5,800,951
[45] Date of Patent: Sep. 1, 1998

[54] EXPOSURE METHOD AND EXPOSURE MASK WITH MONITORING PATTERNS

[75] Inventor: Takeo Hashimoto, Tokyo, Japan

[73] Assignee: NEC Corporation, Tokyo, Japan

[21] Appl. No.: 754,367

[22] Filed: Nov. 22, 1996

[30] Foreign Application Priority Data

Nov. 22, 1995  [JP]  Japan ................... 7-304792

[51] Int. Cl.⁶ .................................. G03F 9/00
[52] U.S. Cl. ............................ 430/5; 430/22
[58] Field of Search .................... 430/5, 22, 311

[56] References Cited

U.S. PATENT DOCUMENTS

| | | | |
|---|---|---|---|
| 5,262,258 | 11/1993 | Yanagisawa | 430/22 |
| 5,491,534 | 2/1996 | Shiozawa | 355/69 |
| 5,601,957 | 6/1995 | Mizutani et al. | 430/22 |

FOREIGN PATENT DOCUMENTS

| | | |
|---|---|---|
| 60-169163 | 9/1985 | Japan . |
| 63-151948 | 6/1988 | Japan . |
| 7-66103 | 3/1995 | Japan . |
| 7-74092 | 3/1995 | Japan . |

*Primary Examiner*—S. Rosasco
*Attorney, Agent, or Firm*—Foley & Lardner

[57] ABSTRACT

An exposure method which makes it possible to determine the amount of exposure and the placement error with the use of fewer monitoring patterns is provided. A scribing region of an exposure mask includes a first monitoring pattern of geometric shapes and a second monitoring pattern of geometric shapes. The shapes of the first pattern are arranged at a constant pitch and have the same size. The shapes of the second pattern are arranged at the same pitch as that of the shapes of the first pattern and have different sizes from each other. By illuminating the substrate twice using the exposure mask, first and second images of the circuit pattern region and first and second images of the scribing region are formed on the substrate so that the second image of the scribing region is adjacent to the first image of the scribing region. The second image of the shapes of the second pattern is compared with the first image of the shapes of the first pattern. Therefore, the amount of exposure and/or the placement error between the first and second images of the circuit pattern regions can be determined as a result of the comparison.

22 Claims, 9 Drawing Sheets

FIG. 8

EXPOSURE METHOD AND EXPOSURE MASK WITH MONITORING PATTERNS

BACKGROUND OF THE INVENTION

1. Field of the Invention

The present invention relates to an exposure method and an exposure mask used for semiconductor device fabrication, in which the exposure mask has monitoring patterns for monitoring the exposure amount and placement error.

2. Description of the Prior Art

In recent years, the integration scale of semiconductor devices has been increasing with time more and more. For example, in the field of semiconductor memories, there has been achieved the possibility that 256-Mbit or 1-Gbit Dynamic Random Access Memories (DRAMs) will be realized.

Conventionally, progressing miniaturization in response to the increasing integration scale has been accomplished by increasing the numerical aperture (NA) and decreasing the wavelength of exposing light in a reduction projection exposure system termed the "stepper". For 1-Mbit DRAMs corresponding to the minimum linewidth of 1.2 μL on design, the g-line having a wavelength of 436 nm was used as the exposure light. For 16-Mbit DRAMs corresponding to the minimum linewidth of 0.5 μm, the i-line having a wavelength of 365 nm was used as the exposure light.

Further, for the minimum linewidth of 0.30 μm or less, it is difficult for the i-line to ensure the satisfactory depth of focus (DOF) and the satisfactory resolution, Therefore, it has been required that excimer lasers such as a KrF laser (oscillation wavelength: 248 nm) or an ArF laser (oscillation wavelength: 193 nm) are used as the source of the exposure light. The KrF excimer lithography has been already put into the practical use.

On the other hand, for each generation, storage capacity of the DRAMs has increased by four times as much as that of the prior generation. Due to such storage capacity increase, device miniaturization has been unable to prevent the chip size from being enlarged, resulting in chip size increase. Thus, there has been a tendency for the exposure field of the stepper to expand with decreases in the wavelength of the exposure light. For example, the size of the exposure field is 15 mm-square for 1-Mbit DRAMs, 20 mm-square for 16-Mbit DRAMs, and 22 mm-square for DRAMs after the 16-Mbit generations.

However, to expand the exposure field, there arises the following problems.

First, the scale of the projection lens system increases with the expanding exposure field. Therefore, the lens system is very difficult to fabricate.

Second, with the expanding exposure field, because the DOF is affected by the flatness level of a semiconductor substrate (or wafer) this factor cannot be ignored.

As one of the next-generation optical exposure systems, scanning-type exposure systems have attracted a great deal of attention, because they are able to solve the above first and second problems. An example of the conventional scanning-type exposure systems is shown in FIG. 1A.

Figure 1A:
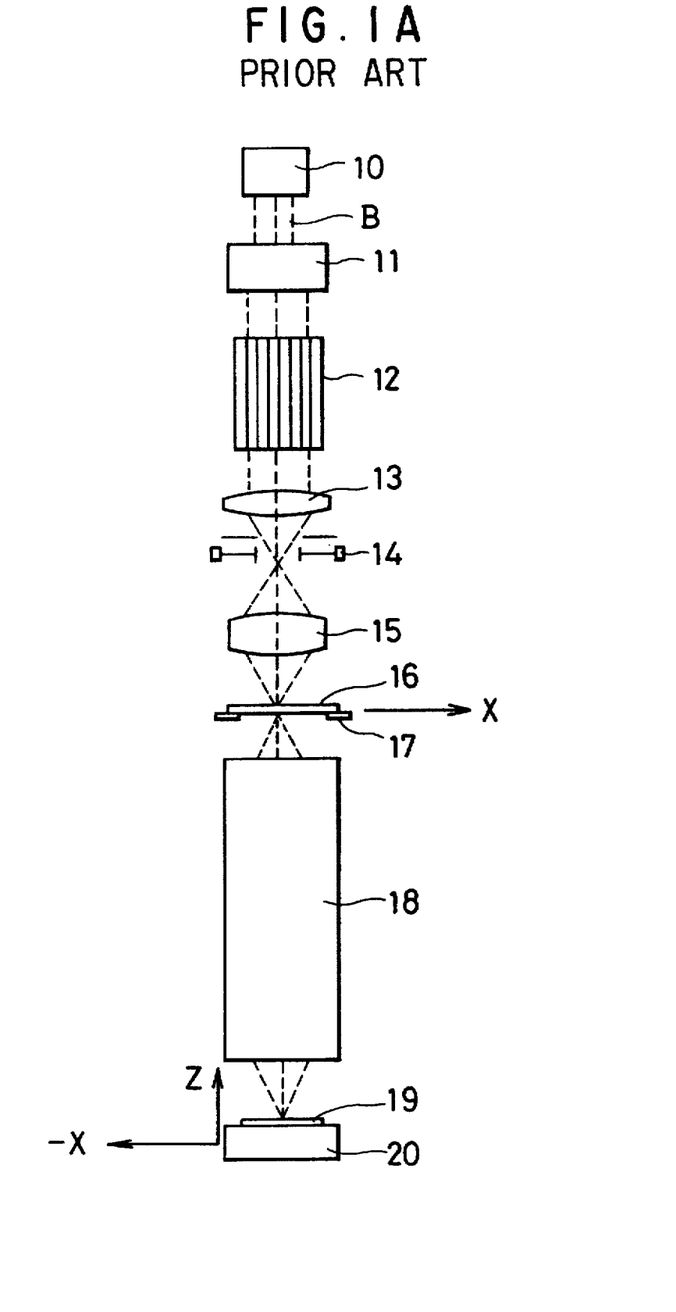
FIG. 1A is a schematic view showing the configuration of a conventional scanning-type optical exposure system.

In FIG. 1A, a source 10 of pulsed exposing light, a beam shaper 11, a fly-eye lens 12, a relay lens 13, a movable reticle blind 14, and a condenser lens 15 constitute an optical illumination system. A reticle stage 17, which is movable in the scanning direction X, holds a reticle 16 thereon. A reduction projection lens system 18 constitutes an optical projection system. A wafer stage 20, which is movable in the directions X, Y, and Z, holds a semiconductor substrate or wafer 19 thereon.

The direction Z is parallel to the optical axis of the beam B of the exposing light. The directions X and Y, which are perpendicular to each other, are in a plane perpendicular to the optical axis or the direction Z.

The scanning-type exposure system shown in FIG. 1A has various differences in configuration from the conventional steppers. A remarkable difference therebetween is that the reticle stage 17 and the wafer stage 20 are scanned in the opposite directions at a speed corresponding to the demagnification ratio of the optical projection system. For example, when the demagnification ratio of the optical projection system is (1/4), the reticle stage 17 is scanned in the direction X at a speed v while the wafer stage 20 is scanned in the opposite direction −x at a speed (v/4).

The conventional scanning-type exposure system shown in FIG. 1A has the following advantages.

Figure 1B:
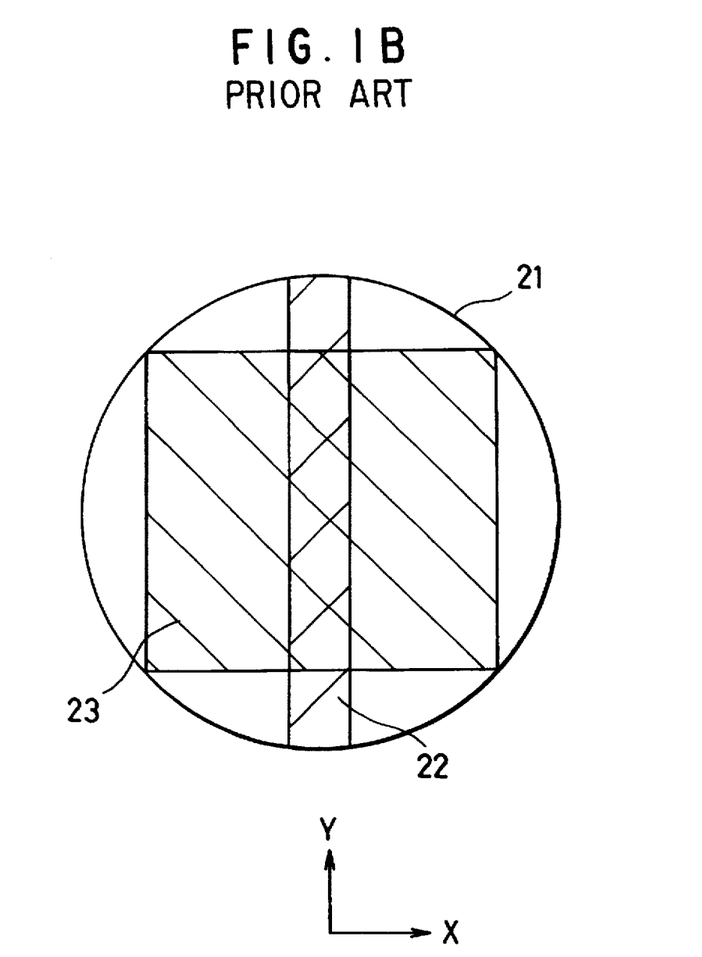
FIG. 1B is a schematic view showing the difference between the slit-shaped illumination area of the scanning-type optical exposure system of FIG. 1 and a conventional stepper.

Specifically, as shown in FIG. 1B, the scanning-type exposure system has a slit-shaped illumination area 22. The slit-shaped beam B of the exposing light is transmitted through the circular aperture 21 of the projection lens system 18 to the substrate 19 to be scanned in the direction X. On the other hand, the conventional stepper has a square illumination area 23. The beam B of the light is transmitted through the square illumination area 23 to the substrate 19. Scanning is not performed in the stepper.

It is seen from FIG. 1B that the diameter of the circular aperture 21 of the projection lens system 18 is able to be decreased to the size corresponding to the length of the square illumination area 23 while keeping substantially the same illumination area.

Because the position in the direction Z and the inclination of the substrate 19 are able to be adjusted, the DOF is difficult to be affected by the flatness level of the substrate 19. Further, lens distortion is limited as a result of the averaging effect caused by the scanning.

The scanning-type exposure system shown in FIG. 1A typically has a excimer laser as the light source 10, which generates the beam B of the pulsed light. Some of the scanning-type exposure systems (for example, "MICRAS-CAN" produced by SVGL corporation) uses Deep Ultra-Violet (DUV) light emitted from a mercury lamp, which is not in the form of pulses. However, with the exposure systems using the DUV light, satisfactory high resolution is difficult to be realized unless a complete optical reflection system is employed.

No laser except for the excimer lasers has been able to generate a high output in the DUV spectral region. Therefore, pulsed light is essentially used for the scanning-type exposure systems.

With the conventional scanning-type exposure system using pulsed light, however, it is difficult to control the amount of exposure; especially, satisfactory uniformity of exposure over the entire exposure field is difficult to obtain. To realize a desired amount of exposure by using a light source whose exposure amount of each pulse tends to fluctuate, the total amount of exposure may be adjusted by inserting a beam attenuator such as an ND filter into the optical path of the exposing light at a time when the total amount of exposure is close to the target amount. This technique using a beam attenuator was disclosed in Japanese Non-Examined Patent Publication No. 60-169136 published in 1985. However, this technique is designed for the stepper, and as a result, it is unable to be applied to the scanning-type exposure system.

Further, with the scanning-type exposure system, due to the timing difference of the exposing light emission, for example, it may take place that a part of the exposed area of the substrate 19 is applied with the light pulses 40 times, and another part thereof is applied with the light pulses 39 times. In this case, the difference of the exposure amount is 2.5%, which will cause a problem.

To cope with this problem, the devices or techniques disclosed in Japanese Non-Examined Patent Publication Nos. 7-66103 and 7-74092, both of which were published in March 1995, may be employed to thereby obtain uniformity in the amount of exposure. However, these techniques may restrict the improvement in throughput. Therefore, whichever techniques are employed, the exposure amount is difficult to be controlled compared with steppers. These techniques require a means for confirming or detecting the exposure amount on the substrate 19.

Figure 2A:
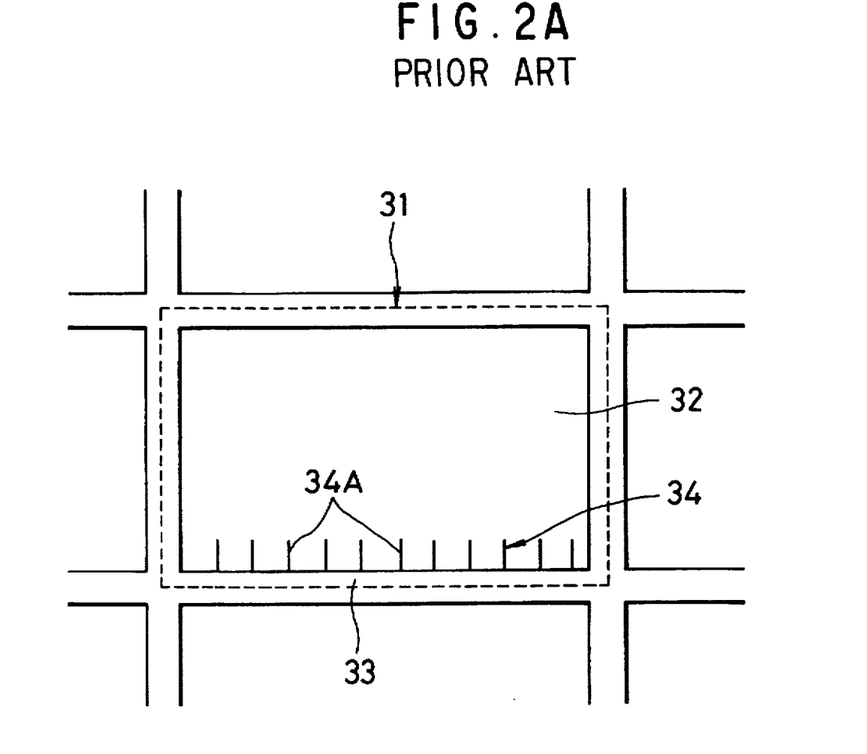
FIG. 2A is a schematic plan view showing the images of the exposure mask on a semiconductor substrate, which is obtained by a conventional exposure method.
Figure 2B:
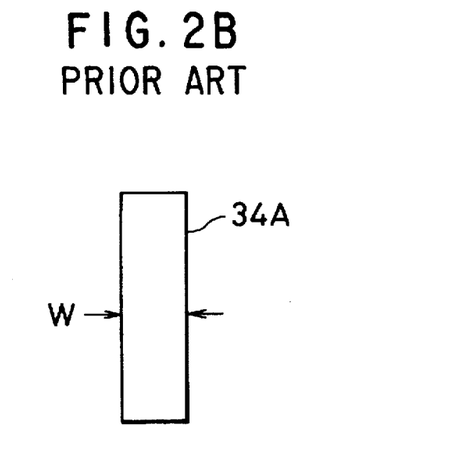
FIG. 2B is a schematic view showing the rectangular shape of a conventional monitoring pattern.

As a popular technique for simply control the exposure amount, a monitoring pattern is formed in a circuit pattern region of an exposure mask, as shown in FIGS. 2A and 2B.

FIG. 2A shows images 31 of the mask or reticle 16 formed on the semiconductor substrate 19, which is realized by the conventional step-and-repeat exposure process. Each of the images 31 includes a transferred circuit pattern region 32 and a transferred subscribing region 33. The region 32 includes a monitoring pattern 34 of rectangular shapes 34A near the edge of the region 32.

FIG. 2B shows the image of the rectangular shape 34A having a width W. The width W is measured by using a suitable measuring means such as a Scanning Electron Microscope (SEM) after the exposure process, and then, the value thus measured is compared with the preset reference value. Thus, whether the exposure has been suitably finished or not is judged.

Additionally, in the conventional steppers, the reticle 16 is fixed during the exposure process and as a result, it is not necessary to consider the positioning error of the reticle 16. On the other hand, in the scanning-type exposure system, since the synchronization error between the reticle 16 and the substrate 19 or wafer stage 20 directly leads to the placement error, a lot of confirmation patterns such as vernier scales need to be formed in the mask or reticle 16, thereby confirming the placement error due to the irregular scanning speed. These techniques were disclosed, for example, in Japanese Non-Examined Patent Publication No. 63-151948 published in 1988 and in U.S. Pat. No. 5,262,258 published in November, 1993.

With the conventional technique as shown in FIGS. 2A and 2B, to judge whether the exposure amount is appropriate or not, the monitoring pattern 34 needs to be measured by a measuring system or device with the use of an electron beam. Also, since the multi-point measurement is necessary for each exposure, it takes a lot of time. The reason for the necessity of the electron beam is as follows:

Typically, the conventional scanning-type exposure systems are used for the fabrication of the semiconductor devices where the minimum linewidth of 0.25 μm or less. Therefore, the measurement accuracy of 0.02 μm or less is essential for judging the propriety of the exposure. This means that no optical measurement systems nor devices are able to cope with the measurement accuracy of 0.02 μm or less.

When vernier scales or rectangular patterns are used as the monitoring patterns for monitoring the placement error, they are unable to be used as monitoring patterns for measuring the size of the patterns. This means that the number of the monitoring patterns is extremely large.

If a lot of the monitoring patterns are located in the scribing region, a problem occurs in a dicing process. Specifically, if a lot of monitoring patterns are formed in the scribing region, various films or layers tend to remain in the scribing region. If, for example, an aluminum film is left, the cutting of the substrate 19 is difficult.

If they are all located in the circuit pattern region, a problem occurs that the unusable area of the substrate 19 increases.

SUMMARY OF THE INVENTION

Accordingly, an object of the present invention is to provide an exposure method and an exposure mask which makes it possible to judge the amount of exposure and the placement error with the use of fewer monitoring patterns.

Another object of the present invention is to provide an exposure method and an exposure mask which is able to determine the amount of exposure and the placement error simply and promptly.

The above objects together with others not specifically mentioned will become clear to those skilled in the art from the following description.

According to a first aspect of the present invention, an exposure method is provided, which includes the following steps.

First, an exposure mask having a circuit pattern region and a scribing region formed to surround the circuit pattern region is prepared.

The scribing region includes a first monitoring pattern of geometric shapes and a second monitoring pattern of geometric shapes. The geometric shapes of the first monitoring pattern are arranged at a constant pitch and have the same size.

The geometric shapes of the second monitoring pattern are arranged at the same pitch as that of the geometric shapes of the first monitoring pattern and have different sizes from each other.

Next, a beam of exposing light illuminates a semiconductor substrate using the exposure mask, thereby forming a first image of the circuit pattern region and a first image of the scribing region on the substrate.

The first image of the scribing region includes a first image of the shapes of the first monitoring pattern and a first image of the shapes of the second monitoring pattern.

Further, the beam of the exposing light illuminates the substrate using the exposure mask, thereby forming a second image of the circuit pattern region and a second image of the scribing region on the substrate so that the second image of the scribing region is adjacent to the first image of the scribing region.

The second image of the scribing region includes a second image of the shapes of the first monitoring pattern and a second image of the shapes of the second monitoring pattern. The second image of the shapes of the second monitoring pattern is adjacent to the first image of the shapes of the first monitoring pattern.

Finally, the second image of the shapes of the second monitoring pattern and the first image of the shapes of the first monitoring pattern are compared with each other.

Thus, the exposure amount and/or the placement error between the first and second images of the circuit pattern regions are judged as a result of the comparison.

With the exposure method according to the first aspect of the invention, the scribing region of the exposure mask includes the first monitoring pattern of geometric shapes and the second monitoring pattern of geometric shapes. The geometric shapes of the first monitoring pattern are arranged at a constant pitch and have the same size. The geometric shapes of the second monitoring pattern are arranged at the same pitch as that of the geometric shapes of the first monitoring pattern and have different sizes from each other.

Accordingly, by illuminating the beam of exposing light to the semiconductor substrate twice using the exposure mask at different locations, the first and second images of the circuit pattern region and the first and second images of the scribing region are formed on the substrate so that the second image of the scribing region is adjacent to the first image of the scribing region.

Then, the second image of the geometric shapes of the second monitoring pattern is compared with the first image of the geometric shapes of the first monitoring pattern. Therefore, the exposure amount and/or the placement error between the first and second images of the circuit pattern regions can be judged as a result of the comparison.

This means that the judgment about the exposure amount and the placement error are able to be made simply and promptly with the use of less monitoring patterns.

In a preferred embodiment according to the first aspect, the geometric shapes of the first monitoring pattern are linear and have the same linewidth, and the geometric shapes of the second monitoring pattern are linear and have different linewidths from each other.

The linewidths of the geometric shapes of the second monitoring pattern are preferably monotonously changed.

In a preferred embodiment according to the first aspect, the size of the geometric shape of the second monitoring pattern, which is located at the center of the second monitoring pattern, is equal to that of the geometric shapes of the first monitoring pattern.

In still another preferred embodiment according to the first aspect, the geometric shapes of the second monitoring pattern and the geometric shapes of the first monitoring pattern are formed on the exposure mask so that the second image of the geometric shapes of the second monitoring pattern is opposite to the first image of the geometric shapes of the first monitoring pattern, respectively.

In a further preferred embodiment according to the first aspect, the geometric shapes of the first monitoring pattern are formed near an edge of the scribing region, and the geometric shapes of the second monitoring pattern are formed near an opposite edge of the scribing region.

In this case, the edges are preferably in a scanning direction of the exposure mask.

In a still further preferred embodiment according to the first aspect, the geometric shapes of the first monitoring pattern are formed near an edge of the scribing region, and the geometric shapes of the second monitoring pattern are formed near an opposite edge of the scribing region. The edges are in a scanning direction of the exposure mask. The geometric shapes of the first monitoring pattern are linear and arranged in the scanning direction and have the same linewidth. The geometric shapes of the second monitoring pattern are linear and arranged in the scanning direction and have different linewidths from each other.

According to a second aspect of the present invention, an exposure mask is provided.

The mask includes a circuit pattern region, and a scribing region formed to surround the circuit pattern region.

The scribing region includes a first monitoring pattern of geometric shapes and a second monitoring pattern of geometric shapes. The geometric shapes of the first monitoring pattern are arranged at a constant pitch and have the same size.

The geometric shapes of the second monitoring pattern are arranged at the same pitch as that of the geometric shapes of the first monitoring pattern and have different sizes from each other.

In a preferred embodiment according to the second aspect, the geometric shapes of the first monitoring pattern are linear and have the same linewidth, and the geometric shapes of the second monitoring pattern are linear and have different linewidths from each other.

The linewidths of the geometric shapes of the second monitoring pattern are preferably monotonously changed.

In another preferred embodiment according to the second aspect, the size of the geometric shape of the second monitoring pattern, which is located at the center of the second monitoring pattern, is equal to that of the geometric shapes of the first monitoring pattern.

In still another preferred embodiment according to the second aspect, the geometric shapes of the second monitoring pattern and the geometric shapes of the first monitoring pattern are formed on the exposure mask so that the second image of the geometric shapes of the second monitoring pattern is opposite to the first image of the geometric shapes of the first monitoring pattern, respectively.

In a further preferred embodiment according to the second aspect, the geometric shapes of the first monitoring pattern are formed near an edge of the scribing region, and the geometric shapes of the second monitoring pattern are formed near an opposite edge of the scribing region.

In this case, the edges are preferably in a scanning direction of the exposure mask.

In a still further preferred embodiment according to the second aspect, the geometric shapes of the first monitoring pattern are formed near an edge of the scribing region, and the geometric shapes of the second monitoring pattern are formed near an opposite edge of the scribing region. The edges are in a scanning direction of the exposure mask. The geometric shapes of the first monitoring pattern are linear and arranged in the scanning direction and have the same linewidth. The geometric shapes of the second monitoring pattern are linear and arranged in the scanning direction and have different linewidths from each other.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

A preferred embodiment of the present invention will be described in detail below while referring to the drawings attached.

Figure 3:
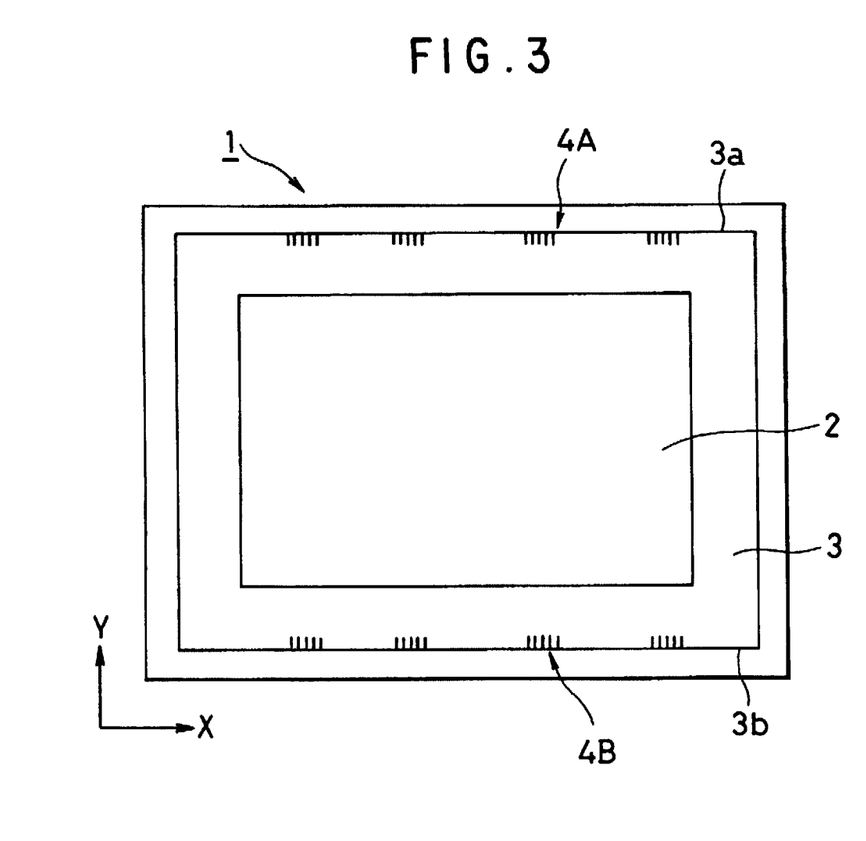
FIG. 3 is a schematic plan view showing an exposure mask according to an embodiment of the invention.

An optical exposure mask according to an embodiment of the invention is shown in FIG. 3.

In FIG. 3, an optical exposure mask 1 with a rectangular plan shape has a circuit pattern region 2 where circuit patterns for semiconductor integrated circuits are formed and a scribing region 3 formed to surround the region 2. The region 2 has a rectangular plan shape, and the region 3 has a rectangular-ringed shape. This mask 1 is used as the reticle 16 in the conventional scanning-type optical exposure system shown in FIG. 1A.

The mask 1 further has a monitoring pattern 4A of geometric shapes and a monitoring pattern 4B of geometric shapes. The pattern 4A is located near the side edge 3a of the scribing region 3, which extends along the scanning direction X. The pattern 4B is located near the side edge 3b of the scribing region 3, which also extends along the scanning direction X. In other words, the two patterns 4A and 4B are formed near the opposite edges 3a and 3b, respectively.

Figure 4:
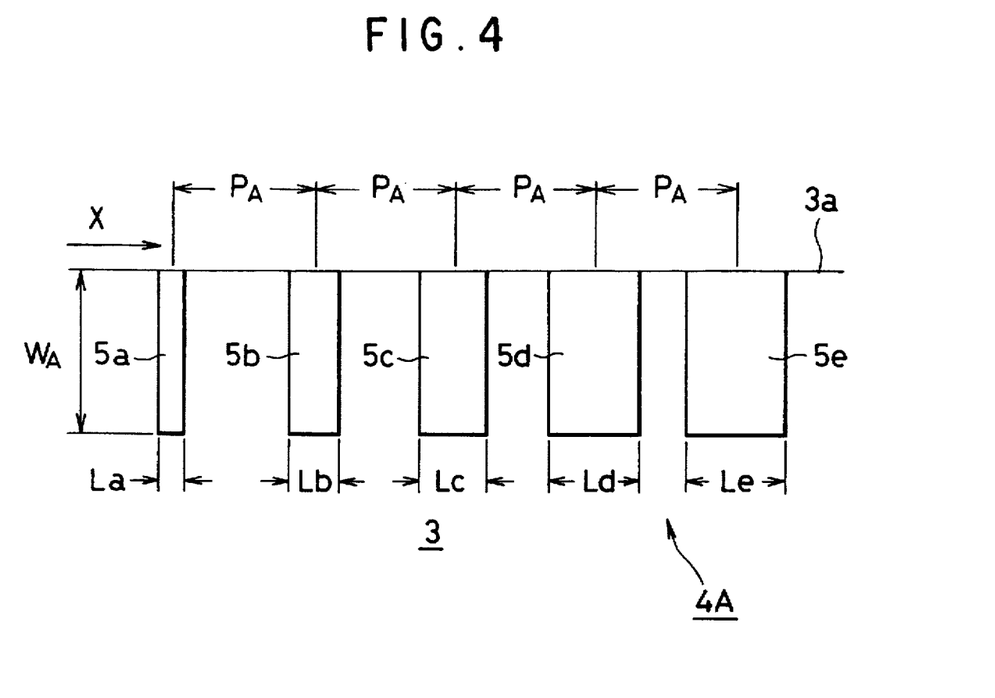
FIG. 4 is an enlarged partial plan view showing the geometrical shapes of the first monitoring pattern of the mask according to the embodiment of FIG. 3.
Figure 5:
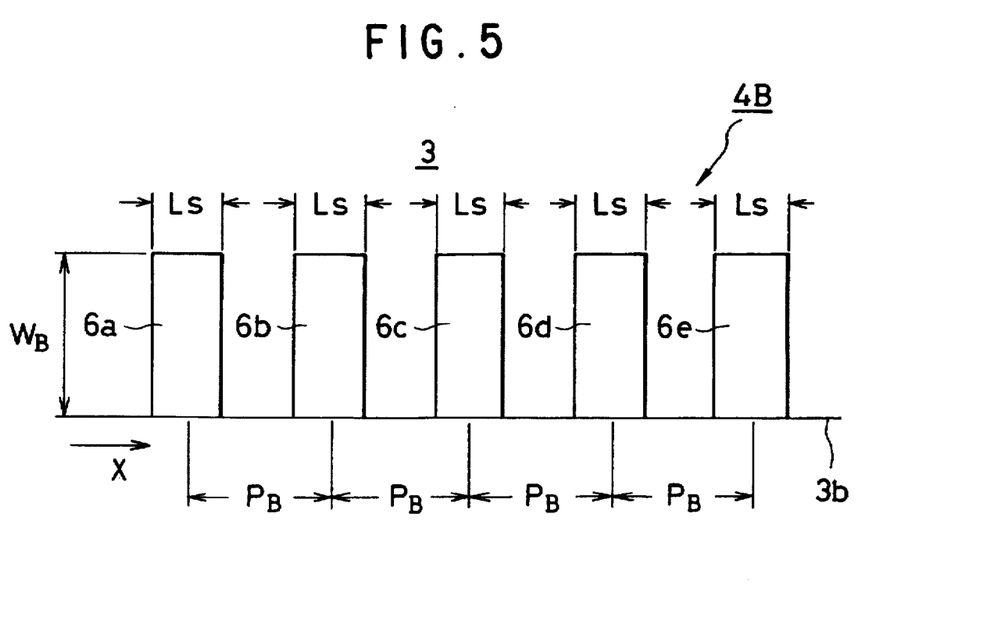
FIG. 5 is an enlarged partial plan view showing the geometrical shapes of the second monitoring pattern of the mask according to the embodiment of FIG. 3.

The detailed configuration of the monitoring patterns 4A and 4B is shown in FIGS. 4 and 5, respectively.

As shown in FIG. 4, the monitoring pattern 4A includes five rectangular shapes 5a, 5b, 5c, 5d, and 5e arranged along the edge 3a at the same pitch $P_A$. These shapes 5a, 5b, 5c, 5d, and 5e have different widths La, Lb, Lc, Ld, and Le, respectively, where La<Lb<Lc<Ld<Le. These shapes 5a, 5b, 5c, 5d, and 5e have the same length $W_A$.

As shown in FIG. 5, the monitoring pattern 4B includes five rectangular shapes 6a, 6b, 6c, 6d, and 6e arranged along the edge 3b at the same pitch $P_B$. The pitch $P_B$ is equal to the pitch $P_A$ of the pattern 4A. These shapes 6a, 6b, 6c, 6d, and 6e have the same widths Ls, respectively. The widths Ls is equal to the width Lc of the shape 5c located at the center of the pattern 4A, i.e., Ls=Lc. These shapes 6a, 6b, 6c, 6d, and 6e have the same length $W_B$. The length $W_B$ may be the same as or different from the length $W_A$.

Next, an exposure method using the above mask 1 and the conventional scanning-type exposure system of FIG. 1A is explained below, where a KrF excimer laser is used as the light source 10.

First, the beam B of the exposing light is illuminated to the semiconductor substrate 19 using the exposure mask 1 as the reticle 16, thereby forming a first image of the circuit pattern region 2 and a first image of the scribing region 3 on the substrate 19. The first image of the scribing region 3 includes a first image of the geometric shapes 5a, 5b, 5c, 5d, and 5e of the monitoring pattern 4A and a first image of the geometric shapes 6a, 6b, 6c, 6d, and 6e of the monitoring pattern 4B.

Next, the beam B of the exposing light is illuminated to the substrate 19 using the mask 1, thereby forming a second image of the circuit pattern region 2 and a second image of the scribing region 3 on the substrate 19 so that the second image of the scribing region 3 is adjacent to the first image of the scribing region 3. The second image of the scribing region 3 includes a second image of the geometric shapes 5a, 5b, 5c, 5d, and 5e of the monitoring pattern 4A and a second image of the geometric shapes 6a, 6b, 6c, 6d, and 6e of the monitoring pattern 4B.

Subsequently, the sate exposure processes are repeated in the step and repeat manner as necessary.

Thus, the exposure process is finished. The state at this stage is shown in FIG. 6.

Figure 6:
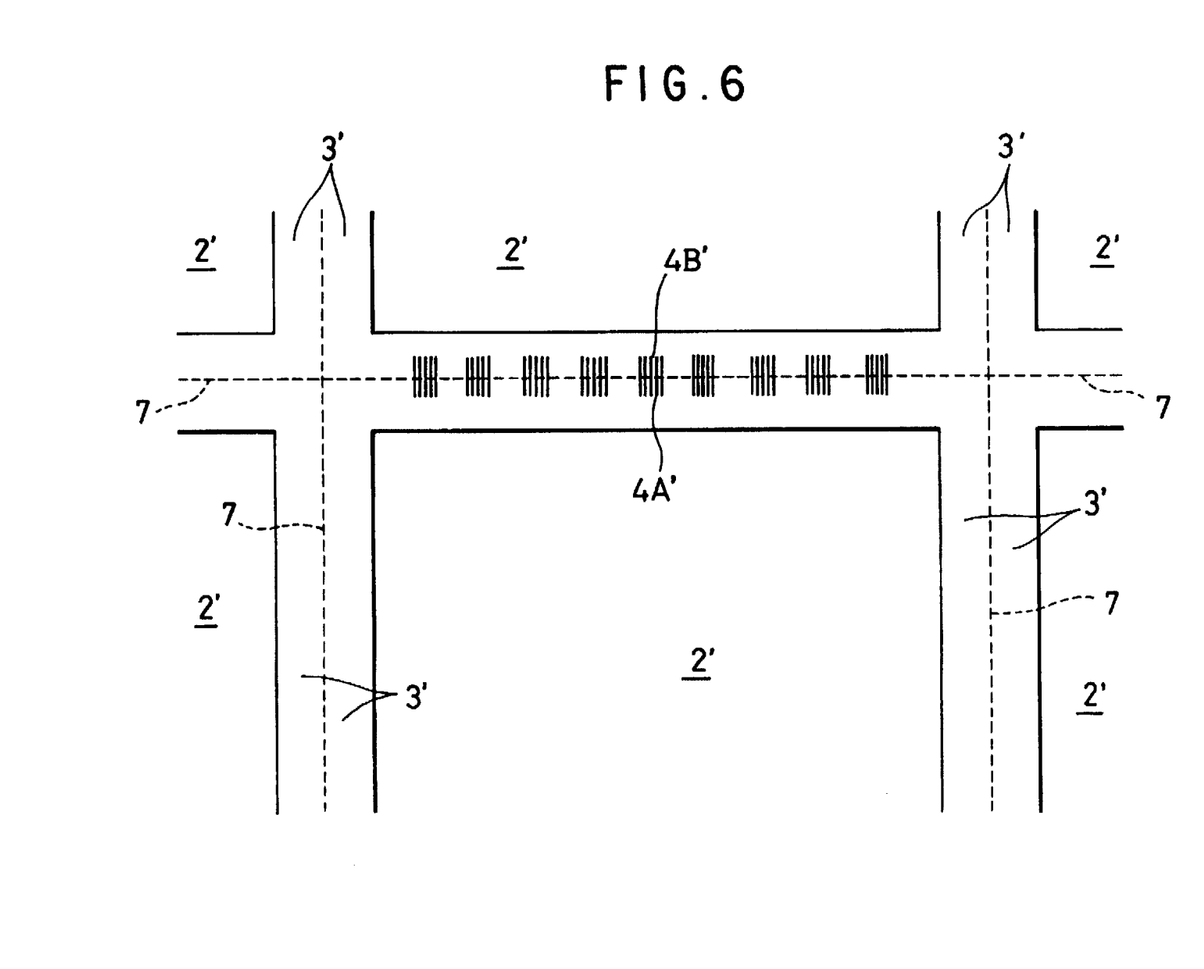
FIG. 6 is an enlarged, partial schematic plan view showing the images of the exposure mask arranged on a semiconductor substrate, which is obtained by an exposure method according to the invention.

As shown in FIG. 6, transferred images 2' of the circuit pattern region 2 are separated by transferred images 3' of the scribing region 3. The images 3' of the scribing region 3 have the same width of 100 μm, in this example.

The approximate center-lines 7 (which are indicated by broken lines in FIG. 6) of the regions 3 indicate boundary lines for each exposure step. In other words, each of the closed rectangular regions surrounded by the boundary lines 7 is an area exposed or illuminated during each exposure step.

Transferred images of the monitoring patterns 4A and 4B are indicated by the reference numbers 4A' and 4B', respectively.

Figure 7:
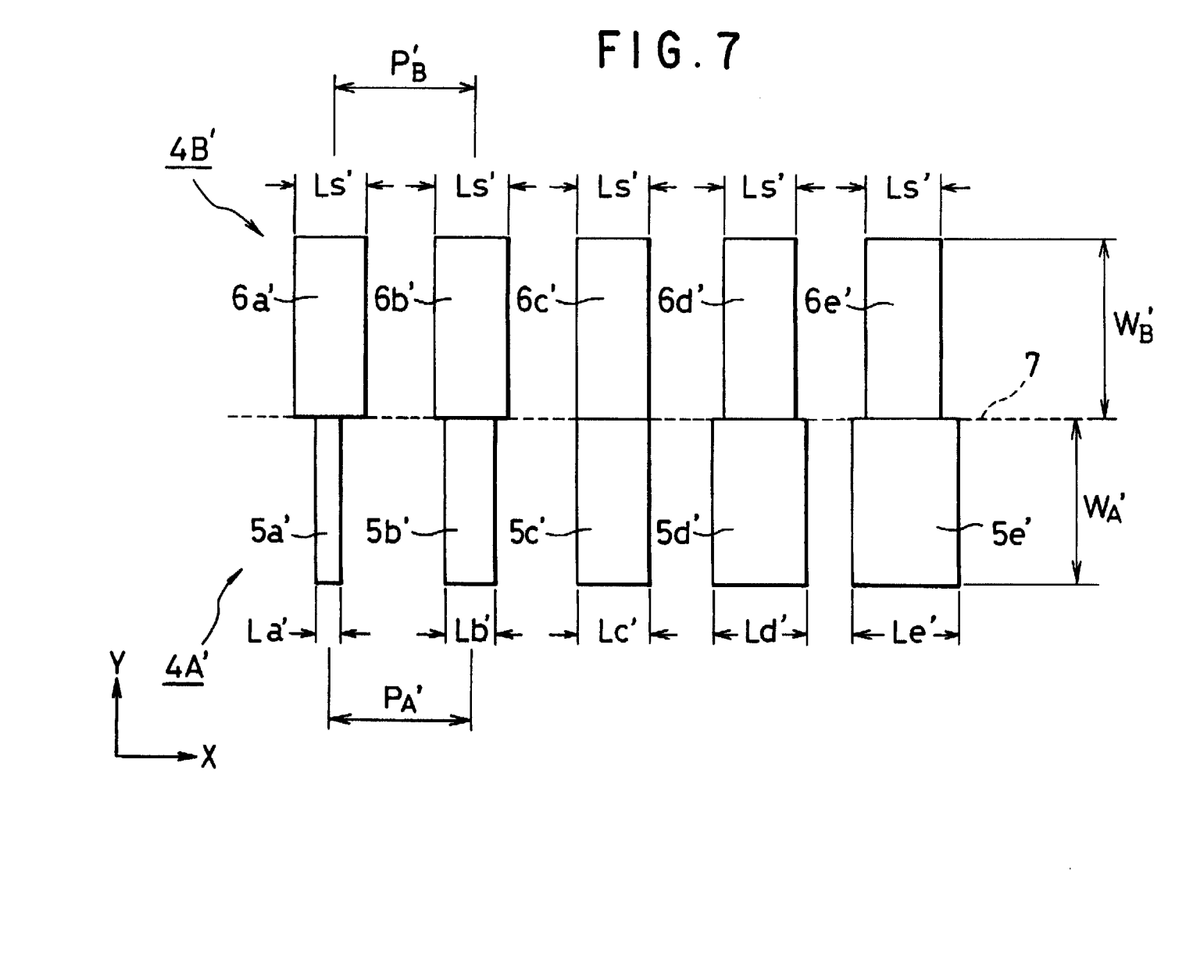
FIG. 7 is an enlarged partial plan view showing the images of the geometrical shapes of the first and second monitoring patterns of the mask, which is obtained by the exposure method according to the invention.

FIG. 7 shows the positional relationship of the transferred images 4A' and 4B' of the monitoring patterns 4A and 4B, which are located adjacent to each other along the direction Y.

In FIG. 7, transferred images 5a', 5b', 5c', 5d' and 5e' of the rectangular shapes 5a, 5b, 5c, 5d and 5e of the monitoring pattern 4A are opposite to and contacted with transferred images 6a', 6b', 6c', 6d' and 6e' of the corresponding rectangular shapes 6a, 6b, 6c, 6d and 6e of the monitoring pattern 4B, respectively.

The transferred images 5a', 5b', 5c', 5d' and 5e' have the widths La', Lb', Lc', Ld', and Le', the same length $W_A$', and the pitch $P_A$', respectively. The transferred images 6a', 6b', 6c', 6d' and 6e' have the same width Ls', the same length $W_a$' (=$W_A$'), and the pitch $P_a$' (=$P_A$'), respectively.

Here, the width of the rectangular shape images 5a', 5b', 5c', 5d' and 5e' of the monitoring pattern image 4A' are set as 0.42 μm, 0.46 μm, 0.50 μm, 0.54 μm, and 0.58 μm, respectively. The width of the rectangular shape images 6a', 6b', 6c', 6d' and 6e' of the monitoring pattern image 4B' is set to be equal to the width Lc' of the transferred image 5c', i.e., Lc=Ls=0.50 μm.

Since the width Lc' of the central shape image 5c' of the monitoring pattern image 4A' is equal to the width Ls' of the shape image 6c' of the monitoring pattern image 4A', by comparison of the pattern images 4A' and 4B'; with each other, it is possible to readily confirm whether the shape image 5c' is greater than the shape image 6c' or not. This means that whether the amount of exposure is suitable or not can be readily judged.

If which one of the widths La', Lb', Lc', Ld', and Le' is equal or close to the width Ls is known, it can be readily judged whether the exposure amount is excessive or insufficient quantitatively.

Further, if the width of the shape is equal to which one of the widths La', Lb', Lc', Ld', or Le' is known, the excessive or insufficient amount of the exposure can be known.

On the other hand, since the pitches $P_A'$ and $P_B'$ of the rectangular shapes of the monitoring pattern images 4A' and 4B' are the same, the center lines of the shape images 5a', 5b', 5c', 5d', and 5e' will be in accordance with the center lines of the corresponding shape images 6a', 6b', 6c', 6d', and 6e', respectively. If it is determined whether one of the center lines is aligned to another, and, the placement accuracy of the mask 1 can be known.

Figure 8:
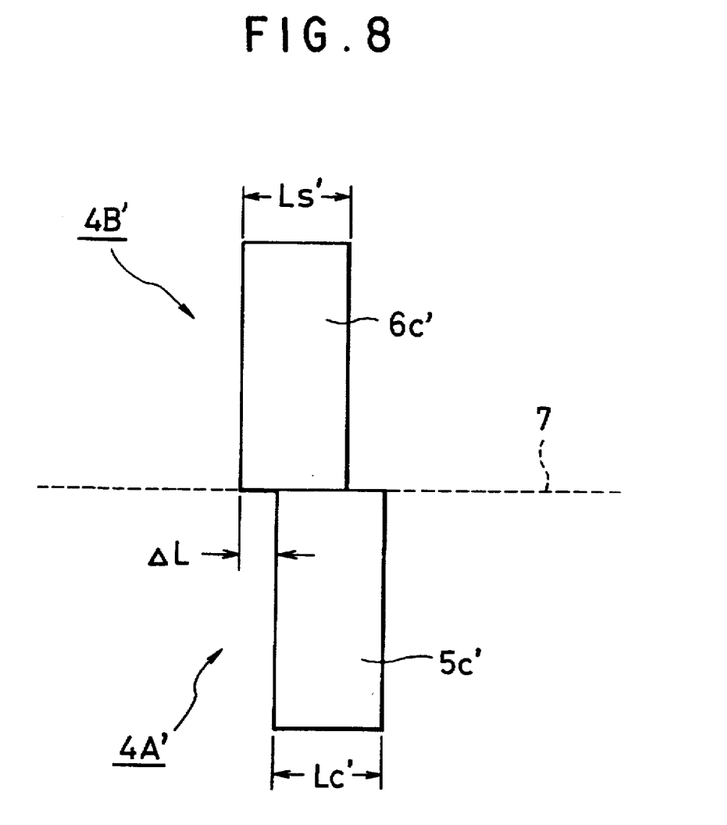
FIG. 8 is an enlarged, partial schematic plan view showing the images of the geometrical shapes of the first and second monitoring patterns of the mask, which is obtained by the exposure method according to the invention.

For example, as shown in FIG. 8, if the central rectangular shape image 5c' and the opposing central rectangular shape image 6c' having the same width are shifted by $\Delta L$ in the scanning direction X, the presence of the synchronized scanning of the mask 1 or reticle 16 with the substrate 19 can be known.

Figure 9:
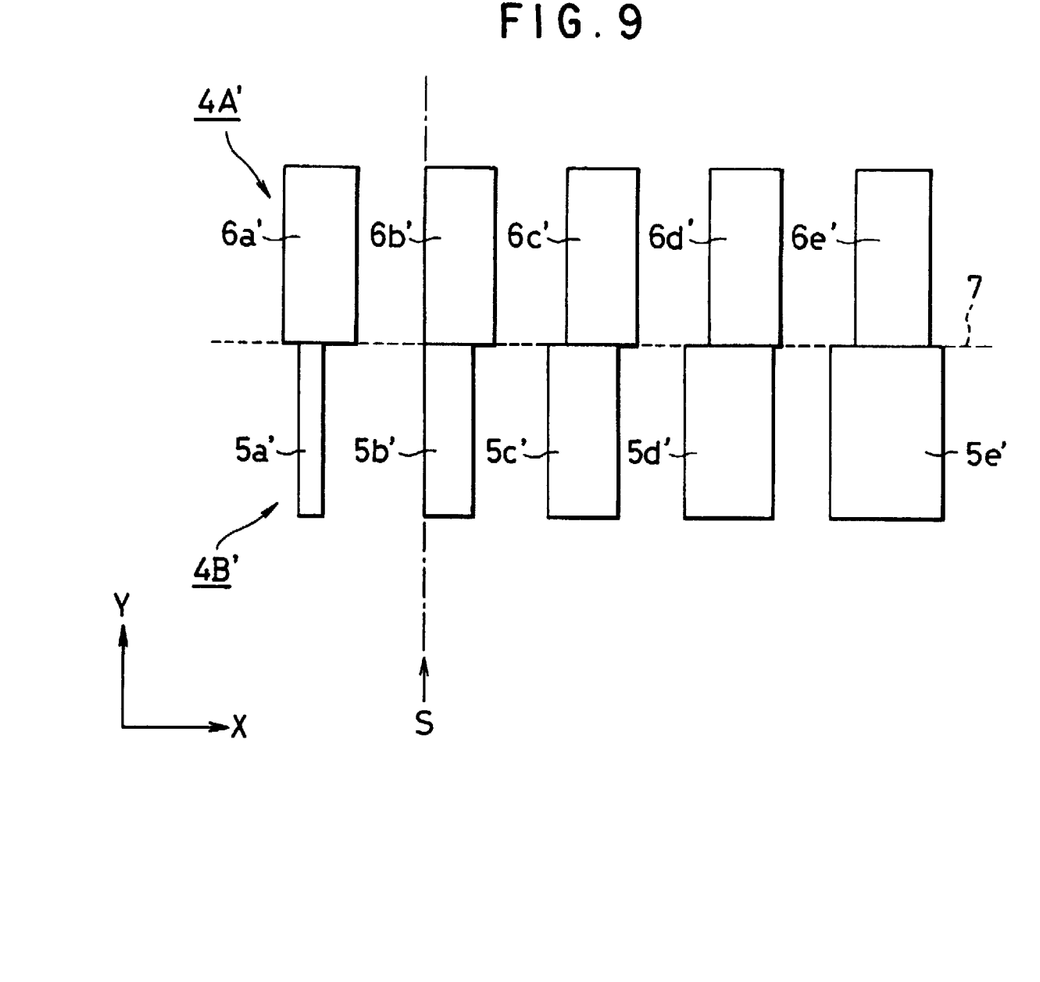
FIG. 9 is an enlarged, partial schematic plan view showing the images of the geometrical shapes of the first and second monitoring patterns of the mask, which is obtained by the exposure method according to the invention.

Further, as shown in FIG. 9, by checking whether one of the side lines of the rectangular shape images 5a', 5b', 5c', 5d', or 5e' of the monitoring pattern image 4A' is aligned to any one of the side lines of the rectangular shape images 6a', 6b', 6c', 6d', and 6e' of the monitoring pattern image 4B', the amount of the placement errors of the mask 1 can be qualitatively analyzed.

On the judgment about the pattern shift, some shift of the patterns, which is typically about 50 nm or less, may be generated because of the lens distortion of the optical lens system in the exposure system of FIG. 1 independent of the scanning rate. This pattern shift due to the lens distortion may be confused with the pattern shift due to the placement error.

However, the pattern shift caused by the lens distortion is constant on each scanning line independent of the location. Therefore, the shift can be discriminated from improper behavior. If any unusual behavior is known in the synchronized scanning, the resultant shift is remarkably large and therefore, it can be judged without comparing the other monitoring pattern.

Accordingly, in this embodiment, if only a single monitoring pattern is provided, both of the exposure suitability and the placement errors can be determined. This means that the necessary number of monitoring patterns can be decreased compared with the case where a plurality of monitoring patterns are necessary.

As a result, if the monitoring patterns are formed in the scribing region 3 so as not to decrease the effective or usable area of the wafer 19, no layers or films are left during the fabrication processes of the semiconductor device. This means that scribing may be readily performed.

Since the exposure amount and/or placement errors can be obtained using a plurality of monitoring patterns whose widths are different from each other, no measurement system with high accuracy is necessary used and the measurement and judgment can be made promptly.

As described above, in the embodiment, the amount of exposure and/or the placement error can be known with the use of less monitoring patterns. Also, the amount of exposure and/or the placement error can be performed simply and promptly.

In the above embodiment of the present invention, the invention is applied to a step-and-scanning type protection exposure system. However, the invention is not limited hereto. The invention may be applied to any other exposure system including steppers.

Although the two monitoring patterns are provided in the above embodiment, only one monitoring pattern may be provided.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An exposure method comprising the steps of:
    (a) preparing an exposure mask having a circuit pattern region and a scribing region formed to surround said circuit pattern region;
        said scribing region including a first monitoring pattern of geometric shapes and a shape monitoring pattern of geometric shapes;
        said geometric shapes of said first monitoring pattern being arranged at a substantially constant pitch and having substantially the same size;
        said geometric shapes of said second monitoring pattern being arranged at substantially the same pitch as that of said geometric shapes of said first monitoring pattern and having different sizes from each other;
    (b) forming a first image of said circuit pattern region and a first image of said scribing region on said substrate using said exposure mask by illuminating said substrate;
        said first image of said scribing region including a first image of said geometric shapes of said first monitoring pattern and a first image of said geometric shapes of said second monitoring pattern;
    (c) forming a second image of said circuit pattern region and a second image of said scribing region on said substrate using said exposure mask by illuminating said substrate so that said second image of said scribing region is adjacent to said first image of said scribing region;
        said second image of said scribing region including a second image of said geometric shapes of said second monitoring pattern and a second image of said geometric shapes of said second monitoring pattern;
        said second image of said geometric shapes of said second monitoring pattern being adjacent to said first image of said geometric shapes of said first monitoring pattern; and
    (d) comparing said second image of said geometric shapes of said second monitoring pattern with said first image of said geometric shapes of said first monitoring pattern to thereby determine at least one of any exposure error and any placement error between said first and second images of said circuit pattern regions.

2. A method as claimed in claim 1, wherein said geometric shapes of said first monitoring pattern are linear and have substantially the same linewidth;
    and wherein said geometric shapes of said second monitoring pattern are linear and have different linewidths from each other.

3. A method as claimed in claim 2, wherein said linewidths of said geometric shapes of said second monitoring pattern are monotonously changed.

4. A method as claimed in claim 1, wherein said second monitoring pattern includes a geometric shape which is located at the center of said second monitoring pattern and has a size substantially equal to that of a corresponding geometric shape located at the center of said first monitoring pattern.

5. A method as claimed in claim 4, wherein said geometric shapes of said first and second monitoring patterns are linear, and respective linewidths of said geometric shape located at the center of said second monitoring pattern and said corresponding geometric shape located at the center of said first monitoring pattern are substantially equal.

6. A method as claimed in claim 1, wherein said geometric shapes of said second monitoring pattern and said geometric shapes of said first monitoring pattern are formed on said exposure mask so that said second image of said geometric shapes of said second monitoring pattern is opposite to said first image of said geometric shapes of said first monitoring pattern.

7. A method as claimed in claim 1, wherein said geometric shapes of said first monitoring pattern are formed near an edge of said scribing region, and said geometric shapes of said second monitoring pattern are formed near an opposite edge of said scribing region.

8. A method as claimed in claim 1, wherein said geometric shapes of said first monitoring pattern are formed near an edge of said scribing region, and said geometric shapes of said second monitoring pattern are formed near an opposite edge of said scribing region;

and wherein said edges are disposed in parallel with a scanning direction of said exposure mask.

9. A method as claimed in claim 1, wherein said geometric shapes of said first monitoring pattern are formed near an edge of said scribing region, and said geometric shapes of said second monitoring pattern are formed near an opposite edge of said scribing region;

and wherein said edges are disposed in parallel with a scanning direction of said exposure mask;

and wherein said geometric shapes of said first monitoring pattern are linear and arranged in said scanning direction and have substantially the same linewidth;

and wherein said geometric shapes of said second monitoring pattern are linear and arranged in said scanning direction and have different linewidths from each other.

10. A method as claimed in claim 1, wherein said step of comparing (d) determines any exposure error.

11. A method as claimed in claim 10, wherein said step of comparing (d) includes comparing respective widths of at least one pair of corresponding images of geometric shapes of said first and second monitoring patterns.

12. A method as claimed in claim 1, wherein said step of comparing (d) determines any placement error between said first and second images of said circuit pattern regions.

13. A method as claimed in claim 1, wherein said step of comparing (d) determines both exposure error and placement error.

14. An exposure mask comprising:

a circuit pattern region;

a scribing region formed to surround said circuit pattern region;

said scribing region including a first monitoring pattern of geometric shapes and a second monitoring pattern of geometric shapes;

said geometric shapes of said first monitoring pattern being arranged at a substantially constant pitch and having substantially the same size; and said geometric shapes of said second monitoring pattern being arranged at substantially the same pitch as that of said geometric shapes of said first monitoring pattern and having different sizes from each other.

15. A mask as claimed in claim 14, wherein said geometric shapes of said first monitoring pattern are linear and have substantially the same linewidth;

and wherein said geometric shapes of said second monitoring pattern are linear and have different linewidths from each other.

16. A mask as claimed in claim 15, wherein said linewidths of said geometric shapes of said second monitoring pattern are monotonously changed.

17. A mask as claimed in claim 14, wherein said second monitoring pattern includes a geometric shape which is located at the center of said second monitoring pattern and has a size equal to that of said geometric shapes of said first monitoring pattern.

18. A mask as claimed in claim 17, wherein said geometric shapes of said first and second monitoring patterns are linear, and respective linewidths of said geometric shape located at the center of said second monitoring pattern and said corresponding geometric shape located at the center of said first monitoring pattern are substantially equal.

19. A mask as claimed in claim 14, wherein said geometric shapes of said second monitoring pattern and said geometric shapes of said first monitoring pattern are formed on said exposure mask so that said second image of said geometric shapes of said second monitoring pattern is opposite to said first image of said geometric shapes of said first monitoring pattern.

20. A mask as claimed in claim 14, wherein said geometric shapes of said first monitoring pattern are formed near an edge of said scribing region, and said geometric shapes of said second monitoring pattern are formed near an opposite edge of said scribing region.

21. A mask as claimed in claim 14, wherein said geometric shapes of said first monitoring pattern are formed near an edge of said scribing region, and said geometric shapes of said second monitoring pattern are formed near an opposite edge of said scribing region;

and wherein said edges are disposed in parallel with a scanning direction of said exposure mask.

22. A mask as claimed in claim 14, wherein said geometric shapes of said first monitoring pattern are formed near an edge of said scribing region, and said geometric shapes of said second monitoring pattern are formed near an opposite edge of said scribing region;

and wherein said edges are disposed in parallel with a scanning direction of said exposure mask;

and wherein said geometric shapes of said first monitoring pattern are linear and arranged in said scanning direction and have the same linewidth;

and wherein said geometric shapes of said second monitoring pattern are linear and arranged in said scanning direction and have different linewidths from each other.

* * * * *